(12) United States Patent
Kuratomi et al.

(10) Patent No.: US 10,418,246 B2
(45) Date of Patent: Sep. 17, 2019

(54) REMOTE HYDROGEN PLASMA TITANIUM DEPOSITION TO ENHANCE SELECTIVITY AND FILM UNIFORMITY

(71) Applicant: Applied Materials, Inc., Santa Clara, CA (US)

(72) Inventors: Takashi Kuratomi, San Jose, CA (US); Avgerinos V. Gelatos, Scotts Valley, CA (US); I-Cheng Chen, San Jose, CA (US); Faruk Gungor, San Jose, CA (US)

(73) Assignee: Applied Materials, Inc., Santa Clara, CA (US)

( * ) Notice: Subject to any disclaimer, the term of this patent is extended or adjusted under 35 U.S.C. 154(b) by 0 days.

(21) Appl. No.: 15/802,040

(22) Filed: Nov. 2, 2017

(65) Prior Publication Data

US 2018/0122647 A1     May 3, 2018

Related U.S. Application Data

(60) Provisional application No. 62/417,087, filed on Nov. 3, 2016, provisional application No. 62/453,113, filed on Feb. 1, 2017.

(51) Int. Cl.

| | | |
|---|---|---|
| *H01L 21/285* | (2006.01) |
| *C23C 16/06* | (2006.01) |
| *C23C 16/455* | (2006.01) |
| *C23C 16/50* | (2006.01) |
| *C23C 16/04* | (2006.01) |
| *C23C 16/14* | (2006.01) |
| *C23C 16/452* | (2006.01) |
| *H01J 37/00* | (2006.01) |
| *H01L 21/3205* | (2006.01) |
| *H01L 21/67* | (2006.01) |

(52) U.S. Cl.
CPC ........ *H01L 21/28568* (2013.01); *C23C 16/04* (2013.01); *C23C 16/06* (2013.01); *C23C 16/14* (2013.01); *C23C 16/452* (2013.01); *C23C 16/45565* (2013.01); *C23C 16/45574* (2013.01); *C23C 16/50* (2013.01); *H01J 37/00* (2013.01); *H01L 21/28562* (2013.01); *H01L 21/32051* (2013.01); *H01L 21/28518* (2013.01); *H01L 21/67167* (2013.01)

(58) Field of Classification Search
CPC .......... H01L 21/28562; H01L 21/0228; H01L 21/02205; H01L 21/3141; H01L 21/02186
See application file for complete search history.

(56) References Cited

U.S. PATENT DOCUMENTS

| | | | |
|---|---|---|---|
| 6,503,330 B1 * | 1/2003 | Sneh | C23C 16/02 118/715 |
| 8,257,790 B2 | 9/2012 | Narushima et al. | |
| 2014/0099794 A1 | 4/2014 | Ingle et al. | |
| 2016/0365246 A1 * | 12/2016 | Yamamoto | C23C 16/02 |
| 2017/0107614 A1 * | 4/2017 | Lee | C23C 16/345 |

* cited by examiner

*Primary Examiner* — Zandra V Smith
*Assistant Examiner* — John M Parker
(74) *Attorney, Agent, or Firm* — Servilla Whitney LLC

(57) ABSTRACT

Methods and apparatus to selectively deposit metal films (e.g., titanium films) are described. One of the precursors is energized to form ions and radicals of the precursor. The precursors flow through separate channels of a dual channel gas distribution assembly to react in a processing region above a substrate.

8 Claims, 8 Drawing Sheets

REMOTE HYDROGEN PLASMA TITANIUM DEPOSITION TO ENHANCE SELECTIVITY AND FILM UNIFORMITY

CROSS-REFERENCE TO RELATED APPLICATIONS

This application claims priority to U.S. Provisional Application No. 62/417,087, filed Nov. 3, 2016, and U.S. Provisional Application No. 62/453,113, filed Feb. 1, 2017, the entire disclosures of which are hereby incorporated by reference herein.

TECHNICAL FIELD

The present disclosure relates generally to apparatus and methods for depositing semiconductor films. In particular, the disclosure relates to apparatus and methods for depositing titanium films with enhanced selectivity and film uniformity.

BACKGROUND

Integrated circuits are made possible by processes which produce intricately patterned material layers on substrate surfaces. Producing patterned material on a substrate requires controlled methods for removal of exposed material. Selectively depositing a film on one surface relative to a different surface is useful for patterning and other applications.

Plasma-Enhanced Chemical Vapor Deposition (PECVD) using direct plasma has been shown to deposit metal films (e.g., titanium) selectively on silicon relative to silicon oxide surfaces with selectivity up to 8:1. However, the film deposited is non-uniform due to the uniformity of the direct plasma distribution.

Therefore, there is a need in the art for apparatus and methods to increase deposition uniformity for selectively deposited films.

SUMMARY

One or more embodiments of the disclosure are directed to processing methods comprising flowing a first precursor into a volume in a processing chamber. The volume is bounded by a chamber top and a gas distribution assembly. The first precursor is energized in the volume and allowed to flow through first fluid channels formed in the gas distribution assembly into a processing region in the processing chamber. A second precursor is flowed through second fluid channels in the gas distribution assembly into the processing region to react the first precursor in the processing region.

Additional embodiments of the disclosure are directed to processing methods comprising positioning a substrate with a first surface and a second surface different from the first surface in a processing region of a processing chamber. An energized first precursor is flowed through a dual channel gas distribution assembly into the processing region. A second precursor is flowed through the dual channel gas distribution assembly into the processing region. The energized first precursor and the second precursor are reacted in the processing region to deposit a film on the first surface.

Further embodiments of the disclosure are directed to processing methods comprising positioning a substrate with a first surface and a second surface different from the first surface in a processing region of a processing chamber. The first surface comprises silicon and the second surface comprises silicon oxide. A first precursor comprising $H_2$ is energized to form $H^+$ and $H^*$ species in a volume and the energized first precursor is flowed through first fluid channels in a dual channel gas distribution assembly into the processing region. A second precursor comprising titanium chloride is flowed through second fluid channels in the dual channel gas distribution assembly into the processing region. The second fluid channels are isolated from the first fluid channels. The energized first precursor and the second precursor are reacted in the processing region to deposit a titanium film selectively on the first surface relative to the second surface with a selectivity greater than or equal to about 10:1.

BRIEF DESCRIPTION OF THE DRAWINGS

So that the manner in which the above recited features of the present disclosure can be understood in detail, a more particular description of the disclosure, briefly summarized above, may be had by reference to embodiments, some of which are illustrated in the appended drawings. It is to be noted, however, that the appended drawings illustrate only typical embodiments of this disclosure and are therefore not to be considered limiting of its scope, for the disclosure may admit to other equally effective embodiments.

In the appended figures, similar components and/or features may have the same reference label. Further, various components of the same type may be distinguished by following the reference label by a dash and a second label that distinguishes among the similar components. If only the first reference label is used in the specification, the description is applicable to any one of the similar components having the same first reference label irrespective of the second reference label.

DETAILED DESCRIPTION

Before describing several exemplary embodiments of the disclosure, it is to be understood that the disclosure is not limited to the details of construction or process steps set forth in the following description. The disclosure is capable of other embodiments and of being practiced or being carried out in various ways.

A "substrate" as used herein, refers to any substrate or material surface formed on a substrate upon which film processing is performed during a fabrication process. For example, a substrate surface on which processing can be performed include materials such as silicon, silicon oxide, strained silicon, silicon on insulator (SOI), carbon doped silicon oxides, amorphous silicon, doped silicon, germanium, gallium arsenide, glass, sapphire, and any other materials such as metals, metal nitrides, metal alloys, and other conductive materials, depending on the application. Substrates include, without limitation, semiconductor wafers. Substrates may be exposed to a pretreatment process to polish, etch, reduce, oxidize, hydroxylate, anneal and/or bake the substrate surface. In addition to film processing directly on the surface of the substrate itself, in the present disclosure, any of the film processing steps disclosed may also be performed on an under-layer formed on the substrate as disclosed in more detail below, and the term "substrate surface" is intended to include such under-layer as the context indicates. Thus for example, where a film/layer or partial film/layer has been deposited onto a substrate surface, the exposed surface of the newly deposited film/layer becomes the substrate surface.

As used in this specification and the appended claims, the terms "precursor", "reactant", "reactive gas" and the like are used interchangeably to refer to any gaseous species that can react with the substrate surface.

Figure 1:
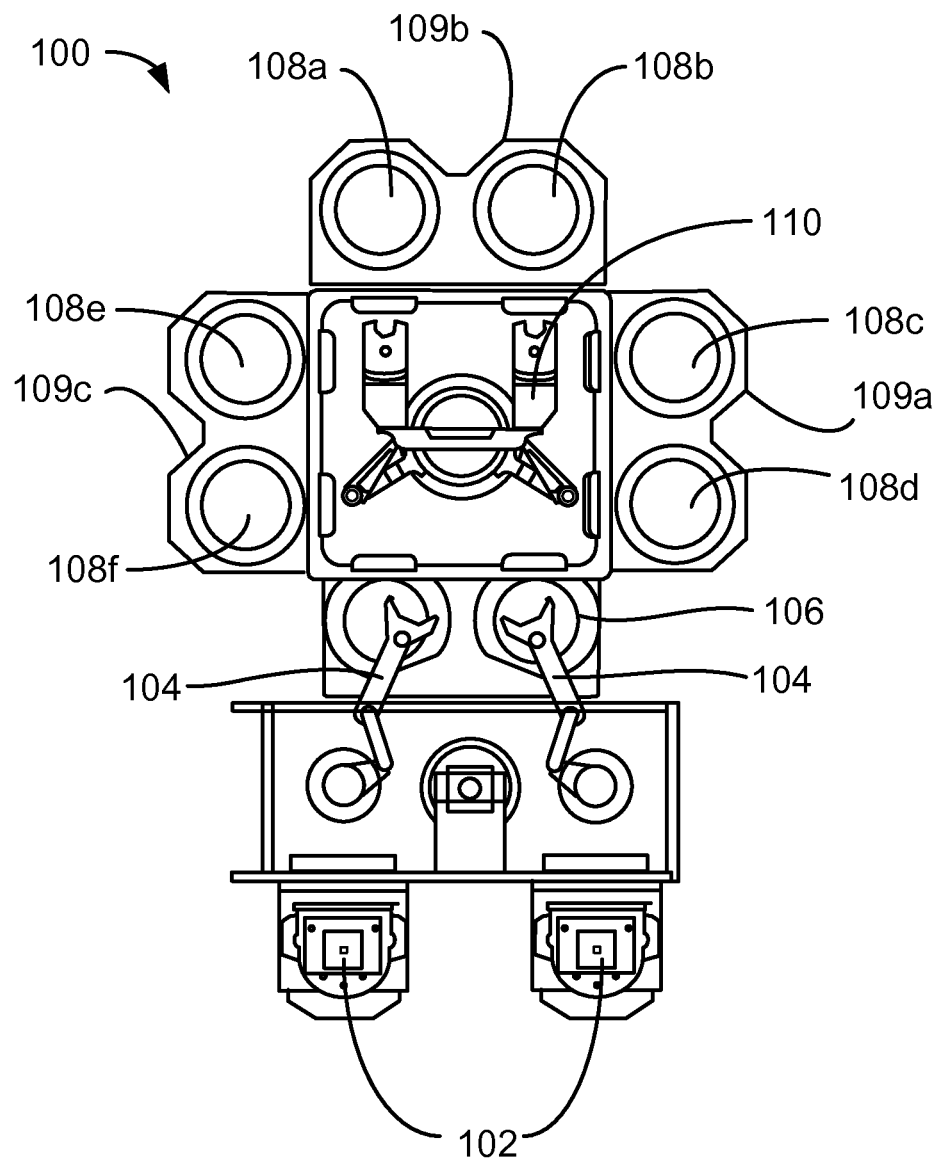
FIG. 1 shows a top plan view of one embodiment of an exemplary processing tool in accordance with one or more embodiment of the disclosure.

FIG. 1 shows a top plan view of one embodiment of a processing tool 100 for deposition, etching, baking, and/or curing according to one or more embodiments of the disclosure. In the figure, a pair of FOUPs (front opening unified pods) 102 supply substrates (e.g., specified diameter semiconductor wafers) that may be received by robotic arms 104 and placed into a low-pressure holding area 106 before being placed into one of the substrate processing sections 108a-f of the tandem process chambers 109a-c. A second robotic arm 110 may be used to transport the substrates from the holding area 106 to the processing chambers 108a-f and back.

The substrate processing sections 108a-f of the tandem process chambers 109a-c may include one or more system components for depositing, annealing, curing and/or etching substrates or films thereon. Exemplary films may be flowable dielectrics, but many types of films may be formed or processed with the processing tool. In one configuration, two pairs of the tandem processing sections of the processing chamber (e.g., 108c-d and 108e-f) may be used to deposit the dielectric material on the substrate, and the third pair of tandem processing sections (e.g., 108a-b) may be used to anneal the deposited dielectric. In another configuration, the two pairs of the tandem processing sections of processing chambers (e.g., 108c-d and 108e-f) may be configured to both deposit and anneal a dielectric film on the substrate, while the third pair of tandem processing sections (e.g., 108a-b) may be used for UV or E-beam curing of the deposited film. In still another configuration, all three pairs of tandem processing sections (e.g., 108a-f) may be configured to deposit and cure a dielectric film on the substrate or etch features into a deposited film In yet another configuration, two pairs of tandem processing sections (e.g., 108c-d and 108e-f) may be used for both deposition and UV or E-beam curing of the dielectric, while a third pair of tandem processing sections (e.g. 108a-b) may be used for annealing the dielectric film. In addition, one or more of the tandem processing sections 108a-f may be configured as a treatment chamber, and may be a wet or dry treatment chamber. These process chambers may include heating the dielectric film in an atmosphere that includes moisture. Thus, embodiments of system 100 may include wet treatment tandem processing sections 108 a-b and anneal tandem processing sections 108c-d to perform both wet and dry anneals on the deposited dielectric film. It will be appreciated that additional configurations of deposition, etching, annealing, and curing chambers for dielectric films are contemplated by system 100.

Figure 2:
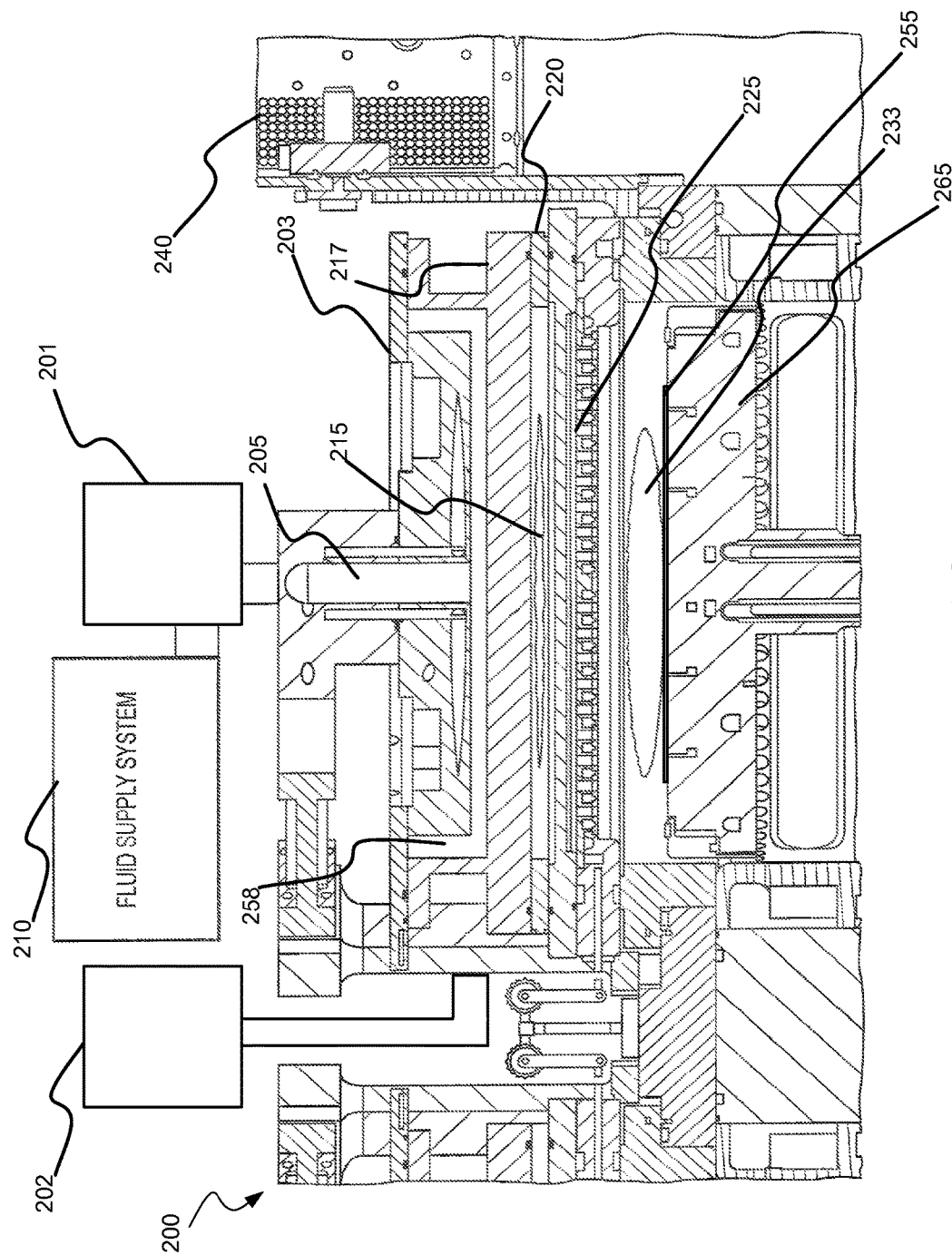
FIG. 2 shows a schematic cross-sectional view of an exemplary processing chamber in accordance with one or more embodiment of the disclosure.

FIG. 2 is a cross-sectional view of an exemplary process chamber section 200 with partitioned plasma generation regions within the processing chambers. During film etching (e.g., silicon, polysilicon, silicon oxide, silicon nitride, silicon oxynitride, silicon oxycarbide), a process gas may be flowed into the first plasma region 215 through a gas inlet assembly 205. A remote plasma system (RPS) 201 may process a first gas which then travels through gas inlet assembly 205, and a second RPS 202 may process a second gas, which then travels through a side inlet in the process chamber 200. The inlet assembly 205 may include two distinct gas supply channels where the second channel (not shown) may bypass the RPS 201. In one example, the first channel provided through the RPS may be used for the process gas and the second channel bypassing the RPS may be used for a treatment gas in disclosed embodiments. The process gas may be excited prior to entering the first plasma region 215 within the RPS 201. A cooling plate 203, faceplate 217, showerhead 225, and a substrate support 265, having a substrate 255 disposed thereon, are shown according to disclosed embodiments. The faceplate 217 may be pyramidal, conical, or of another similar structure with a narrow top portion expanding to a wide bottom portion. The faceplate 217 may additionally be flat as shown and include a plurality of through-channels (not shown) used to distribute process gases. The faceplate (or conductive top portion) 217 and showerhead 225 are shown with an insulating ring 220 in between, which allows an AC potential to be applied to the faceplate 217 relative to showerhead 225. The insulating ring 220 may be positioned between the faceplate 217 and the showerhead 225 enabling a capacitively coupled plasma (CCP) to be formed in the first plasma region. A baffle (not shown) may additionally be located in the first plasma region 215 to affect the flow of fluid into the region through gas inlet assembly 205.

Exemplary configurations include having the gas inlet assembly 205 open into a gas supply region partitioned from the first plasma region 215 by faceplate 217 so that the gases/species flow through the holes in the faceplate 217 into the first plasma region 215. Structural and operational features may be selected to prevent significant backflow of plasma from the first plasma region 215 back into the supply region, gas inlet assembly 205, and fluid supply system 210. The structural features may include the selection of dimensions and cross-sectional geometry of the apertures in faceplate 217 that deactivates back-streaming plasma. The operational features may include maintaining a pressure difference between the gas supply region and first plasma region 215 that maintains a unidirectional flow of plasma through the showerhead 225.

A fluid, such as a precursor, for example a fluorine-containing precursor, may be flowed into the processing region 233 by embodiments of the showerhead described herein. Excited species derived from the process gas in the plasma region 215 may travel through apertures in the showerhead 225 and react with an additional precursor flowing into the processing region 233 from a separate portion of the showerhead. Little or no plasma may be present in the processing region 233. Excited derivatives of the precursors may combine in the region above the substrate and, on occasion, on the substrate to etch structures or remove species on the substrate in disclosed applications.

Exciting the fluids in the first plasma region 215 directly, exciting the fluids in one or both of the RPS units 201, 202, or both, may provide several benefits. The concentration of the excited species derived from the fluids may be increased within the processing region 233 due to the plasma in the first plasma region 215. This increase may result from the location of the plasma in the first plasma region 215. The processing region 233 may be located closer to the first plasma region 215 than the remote plasma system (RPS) 201, leaving less time for the excited species to leave excited states through collisions with other gas molecules, walls of the chamber, and surfaces of the showerhead.

The uniformity of the concentration of the excited species derived from the process gas may also be increased within the processing region 233. This may result from the shape of the first plasma region 215, which may be more similar to the shape of the processing region 233. Excited species created in the RPS 201, 202 may travel greater distances in order to pass through apertures near the edges of the showerhead 225 relative to species that pass through apertures near the center of the showerhead 225. The greater distance may result in a reduced excitation of the excited species and, for example, may result in a slower growth rate near the edge of a substrate. Exciting the fluids in the first plasma region 215 may mitigate this variation for the fluid flowed through RPS 201.

The processing gases may be excited in the RPS 201, 202 and may be passed through the showerhead 225 to the processing region 233 in the excited state. Alternatively, power may be applied to the first processing region to either excite a plasma gas or enhance an already excited process gas from the RPS. While a plasma may be generated in the processing region 233, a plasma may alternatively not be generated in the processing region. In one example, the only excitation of the processing gas or precursors may be from exciting the processing gases in the RPS units 201, 202 to react with one another in the processing region 233.

The processing system may further include a power supply 240 electrically coupled with the processing chamber to provide electric power to the faceplate 217 and/or showerhead 225 to generate a plasma in the first plasma region 215 or processing region 233. The power supply may be configured to deliver an adjustable amount of power to the chamber depending on the process performed.

In addition to the fluid precursors, there may be other gases introduced at varied times for varied purposes, including carrier gases to aid delivery. A treatment gas may be introduced to remove unwanted species from the chamber walls, the substrate, the deposited film and/or the film during deposition. A treatment gas may be excited in a plasma and then used to reduce or remove residual content inside the chamber. In other disclosed embodiments the treatment gas may be used without a plasma. When the treatment gas includes water vapor, the delivery may be achieved using a mass flow meter (MFM), an injection valve, or by commercially available water vapor generators. The treatment gas may be introduced from the first processing region, either through the RPS unit or bypassing the RPS unit, and may further be excited in the first plasma region.

The gas distribution assemblies 225 for use in the processing chamber section 200 are referred to as dual channel showerheads (DCSH) and are detailed in the embodiments described in FIGS. 3A-3D herein. The dual channel showerhead may allow for flowable deposition of a dielectric material, and separation of precursor and processing fluids during operation. The showerhead may alternatively be utilized for etching processes that allow for separation of etchants outside of the reaction zone to provide limited interaction with chamber components and each other prior to being delivered into the processing region.

Referring generally to the showerheads in FIGS. 3A-3D, precursors may be introduced into the processing region by first being introduced into an internal showerhead volume 327 defined in the showerhead 300 by a first manifold 320, or upper plate, and second manifold 325, or lower plate. The manifolds may be perforated plates that define a plurality of apertures. The precursors in the internal showerhead volume 327, typically referred to as the second precursors, may flow into the processing region 233 via apertures 375 formed in the lower plate. This flow path may be isolated from the rest of the process gases in the chamber, and may provide for the precursors to be in an unreacted or substantially unreacted state until entry into the processing region 233 defined between the substrate 255 and a bottom of the lower plate 325. Alternatively, second RPS 202 may be used to excite or produce radical species of the second precursor. These radical species may be maintained separate from the other radical species of the first precursor that may flow through the first apertures 360. Once in the processing region 233, the two precursors may react with each other and the substrate. The second precursor may be introduced into the internal showerhead volume 327 defined in the showerhead 300 through a side channel formed in the showerhead, such as channel 322 as shown in the showerhead embodiments herein. The first precursor gas may be in a plasma state including radicals from the RPS unit or from a plasma generated in the first plasma region. Additionally, a plasma may be generated in the processing region.

Figure 3A:
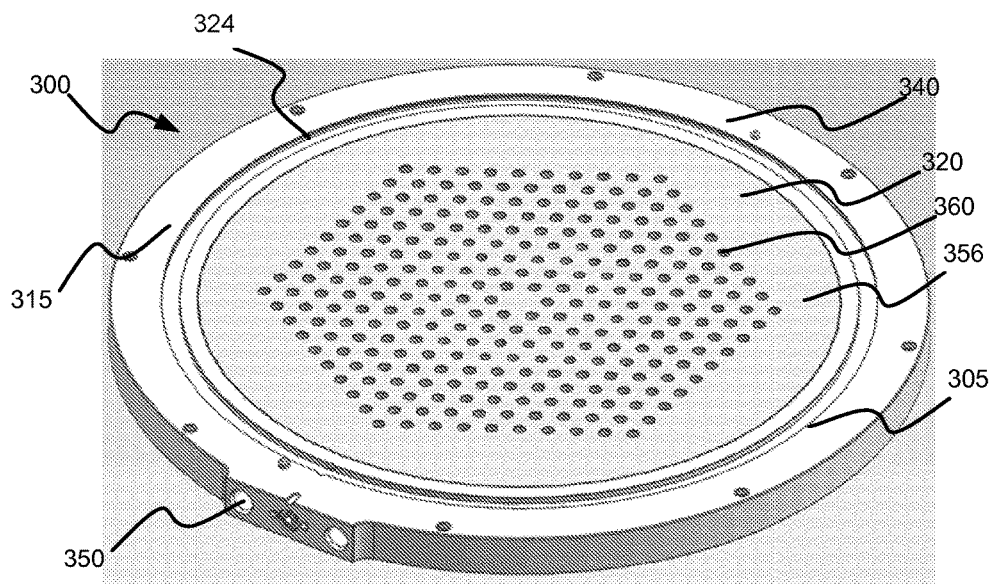
FIGS. 3A-3D show schematic views of exemplary showerhead configurations according to one or more embodiment of the disclosure.
Figure 3B:
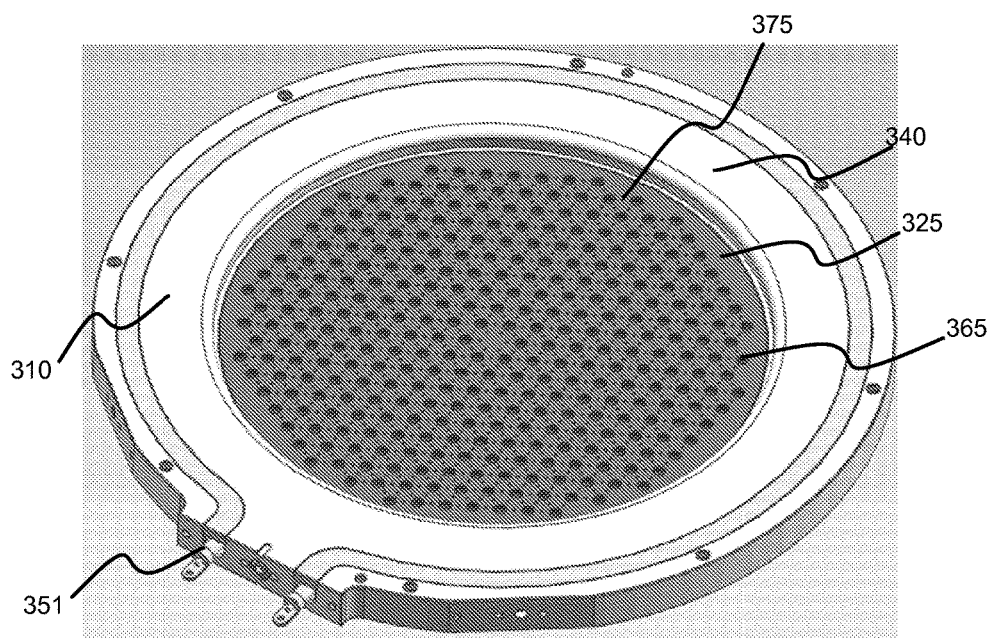
Figure 3C:
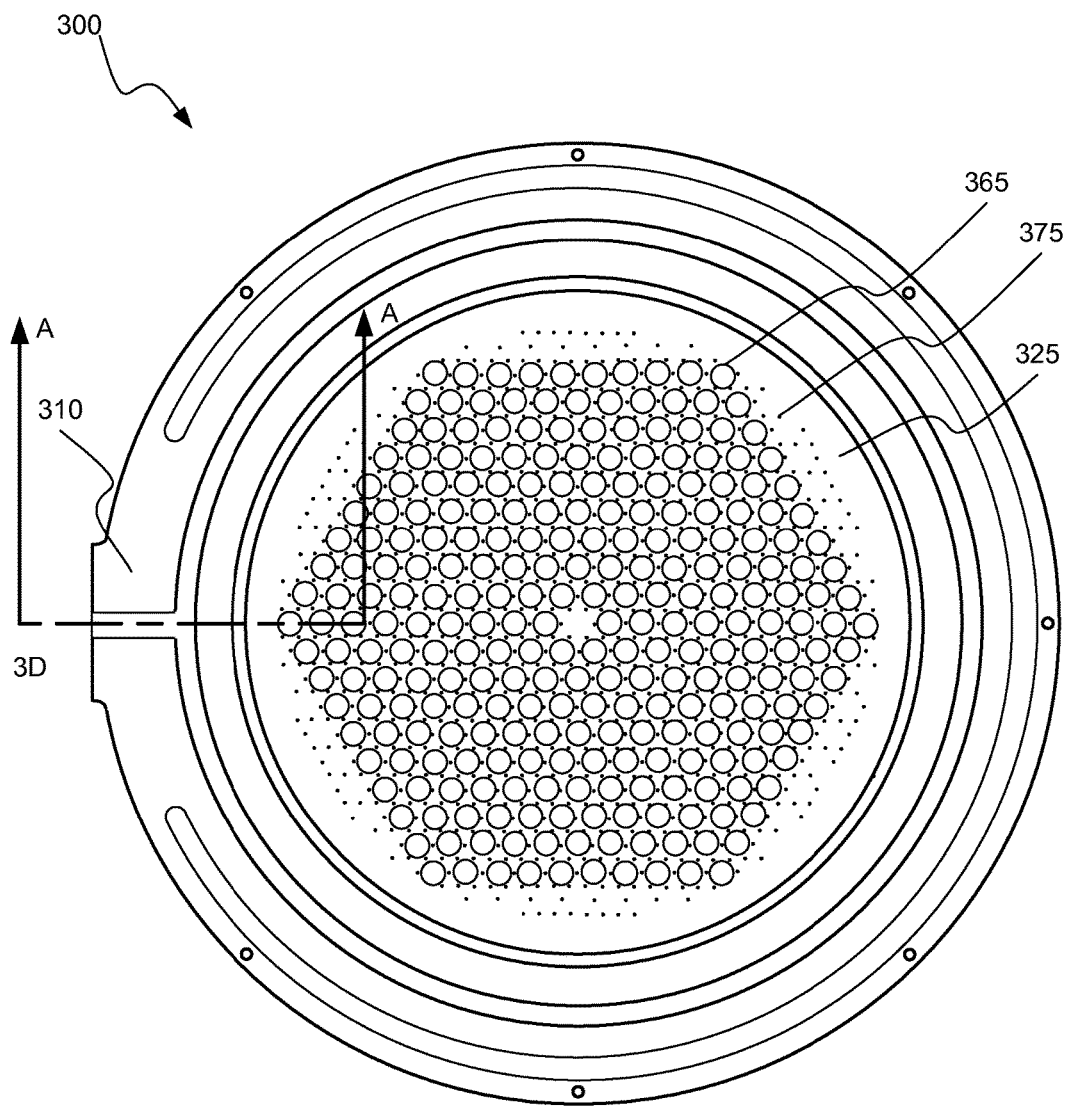
Figure 3D:
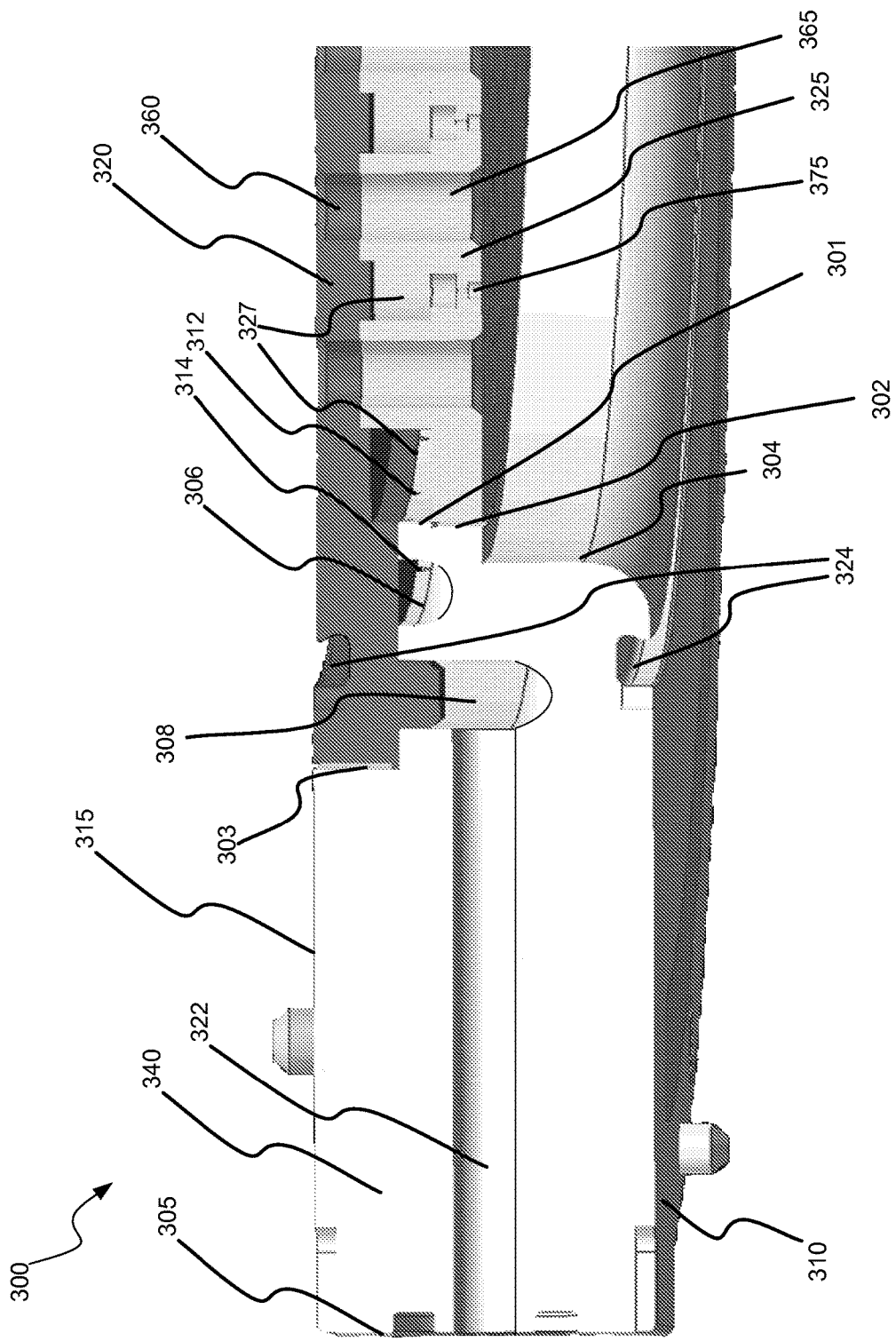

FIG. 3A illustrates an upper perspective view of a gas distribution assembly 300. In usage, the gas distribution system 300 may have a substantially horizontal orientation such that an axis of the gas apertures formed therethrough may be perpendicular or substantially perpendicular to the plane of the substrate support (see substrate support 265 in FIG. 2). FIG. 3B illustrates a bottom perspective view of the gas distribution assembly 300. FIG. 3C is a bottom plan view of the gas distribution assembly 300. FIG. 3D is a cross sectional views of an exemplary embodiment of gas distribution assembly 300 taken along line A-A of FIG. 3C.

Referring to FIGS. 3A-3D, the gas distribution assembly 300 generally includes the annular body 340, the upper plate 320, and the lower plate 325. The annular body 340 may be a ring which has an inner annular wall 301 located at an inner diameter, an outer annular wall 305 located at an outer diameter, an upper surface 315, and a lower surface 310. The upper surface 315 and lower surface 310 define the thickness of the annular body 340. A conduit 350 may be formed in the annular body 340 and a cooling fluid may be flowed within the channel that extends around the circumference of the annular body 340. Alternatively, a heating element 351 may be extended through the channel that is used to heat the showerhead assembly.

One or more recesses and/or channels may be formed in or defined by the annular body as shown in disclosed embodiments including that illustrated in FIG. 3D. The annular body may include an upper recess 303 formed in the upper surface, and a first lower recess 302 formed in the lower surface at the inner annular wall 301. The annular body may also include a second lower recess 304 formed in the lower surface 310 below and radially outward from the first lower recess 302. As shown in FIG. 3D, an inner fluid channel 306 may be defined in the upper surface 315, and may be located in the annular body radially inward of the upper recess 303. The inner fluid channel 306 may be annular in shape and be formed the entire distance around the annular body 340. In disclosed embodiments, a bottom portion of the upper recess 303 intersects an outer wall of the inner fluid channel 306 (not shown). The inner fluid channel may also be at least partially radially outward of the second lower recess 304. A plurality of ports 312 may be defined in an inner wall of the inner fluid channel, also the inner annular wall 301 of the annular body 340. The ports 312 may provide access between the inner fluid channel and the internal volume 327 defined between the upper plate 320 and lower plate 325. The ports may be defined around the circumference of the channel at specific intervals, and may facilitate fluid distribution across the entire region of the volume 327 defined between the upper and lower plates. The intervals of spacing between the ports 312 may be constant, or may be varied in different locations to affect the flow of fluid into the volume. The inner and outer walls, radially, of the inner fluid channel 306 may be of similar or dissimilar height. For example, the inner wall may be formed higher than the outer wall to affect the distribution of fluids in the inner fluid channel to avoid or substantially avoid the flow of fluid over the inner wall of the first fluid channel.

Again referring to FIG. 3D, an outer fluid channel 308 may be defined in the upper surface 315 that is located in the annular body radially outward of the inner fluid channel 306. Outer fluid channel 308 may be an annular shape and be located radially outward from and concentric with inner fluid channel 306. The outer fluid channel 308 may also be located radially outward of the first upper recess 303 such that the outer fluid channel 308 is not covered by the upper plate 320, or may be radially inward of the first upper recess 303 as shown, such that upper plate 320 covers the outer fluid channel 308. A second plurality of ports 314 may be defined in the portion of the annular body 340 defining the outer wall of the inner fluid channel 306 and the inner wall of the outer fluid channel 308. The second plurality of ports 314 may be located at intervals of a pre-defined distance around the channel to provide fluid access to the inner fluid channel 306 at several locations about the outer fluid channel 308. In operation, a precursor may be flowed from outside the process chamber to a delivery channel 322 located in the side of the annular body 340. This delivery channel 322 may be in fluid communication with the second RPS 202 through a second access in the processing chamber. The fluid may flow into the outer fluid channel 308, through the second plurality of ports 314 into the inner fluid channel 306, through the first plurality of ports 312 into the internal volume 327 defined between the upper and lower plates, and through the third apertures 375 located in the bottom plate 325. As such, a fluid provided in such a fashion can be isolated or substantially isolated from any fluid delivered into the first plasma region through apertures 360 until the fluids separately exit the lower plate 325.

The upper plate 320 may be a disk-shaped body, and may be coupled with the annular body 340 at the first upper recess 303. The upper plate 320 may thus cover the first fluid channel 306 to prevent or substantially prevent fluid flow from the top of the first fluid channel 306. The upper plate may have a diameter selected to mate with the diameter of the upper recess 303, and the upper plate may comprise a plurality of first apertures 360 formed therethrough. The first apertures 360 may extend beyond a bottom surface of the upper plate 320 thereby forming a number of raised cylindrical bodies (not shown). In between each raised cylindrical body may be a gap. As seen in FIG. 3A, the first apertures 360 may be arranged in a polygonal pattern on the upper plate 320, such that an imaginary line drawn through the centers of the outermost first apertures 360 define or substantially define a polygonal figure, which may be for example, a six-sided polygon.

The lower plate 325 may have a disk-shaped body having a number of second apertures 365 and third apertures 375 formed therethrough, as especially seen in FIG. 3C. The lower plate 325 may have multiple thicknesses, with the thickness of defined portions greater than the central thickness of the upper plate 320, and in disclosed embodiments at least about twice the thickness of the upper plate 320. The lower plate 325 may also have a diameter that mates with the diameter of the inner annular wall 301 of the annular body 340 at the first lower recess 302. The second apertures 365 may be defined by the lower plate 325 as cylindrical bodies extending up to the upper plate 320. In this way, channels may be formed between the first and second apertures that are fluidly isolated from one another, and may be referred to as first fluid channels. Additionally, the volume 327 formed between the upper and lower plates may be fluidly isolated from the channels formed between the first and second apertures. As such, a fluid flowing through the first apertures 360 will flow through the second apertures 365 and a fluid within the internal volume 327 between the plates will flow through the third apertures 375, and the fluids will be fluidly isolated from one another until they exit the lower plate 325 through either the second or third apertures. Third apertures 375 may be referred to as second fluid channels, which extend from the internal volume 327 through the bottom plate 325. This separation may provide numerous benefits including preventing a radical precursor from contacting a second precursor prior to reaching a processing region. By preventing the interaction of the gases, reactions within the chamber may be minimized prior to the processing region in which the reaction is desired.

The second apertures 365 may be arranged in a pattern that aligns with the pattern of the first apertures 360 as described above. In one embodiment, when the upper plate 320 and bottom plate 325 are positioned one on top of the other, the axes of the first apertures 360 and second apertures 365 align. In disclosed embodiments, the upper and lower plates may be coupled with one another or directly bonded together. Under either scenario, the coupling of the plates may occur such that the first and second apertures are aligned to form a channel through the upper and lower plates. The plurality of first apertures 360 and the plurality of second apertures 365 may have their respective axes parallel or substantially parallel to each other, for example, the apertures 360, 365 may be concentric. Alternatively, the plurality of first apertures 360 and the plurality of second apertures 365 may have the respective axis disposed at an angle from about 1° to about 30° from one another. At the center of the bottom plate 325 there may or may not be a second aperture 365.

Referring again to FIG. 3D, a pair of isolation channels, 324 may be formed in the annular body 340. One of the pair of isolation channels 324 may be defined in the upper plate 320, and the other of the pair of isolation channels 324 may be defined in the lower surface 310 of the annular body 340. Alternatively, as shown in FIG. 3A, one of the pair of isolation channels 324 may be defined in the upper surface 315 of the annular body 340. The pair of isolation channels may be vertically aligned with one another, and in disclosed embodiments may be in direct vertical alignment. Alternatively, the pair of isolation channels may be offset from vertical alignment in either direction. The channels may provide locations for isolation barriers such as o-rings in disclosed embodiments.

Figure 4:
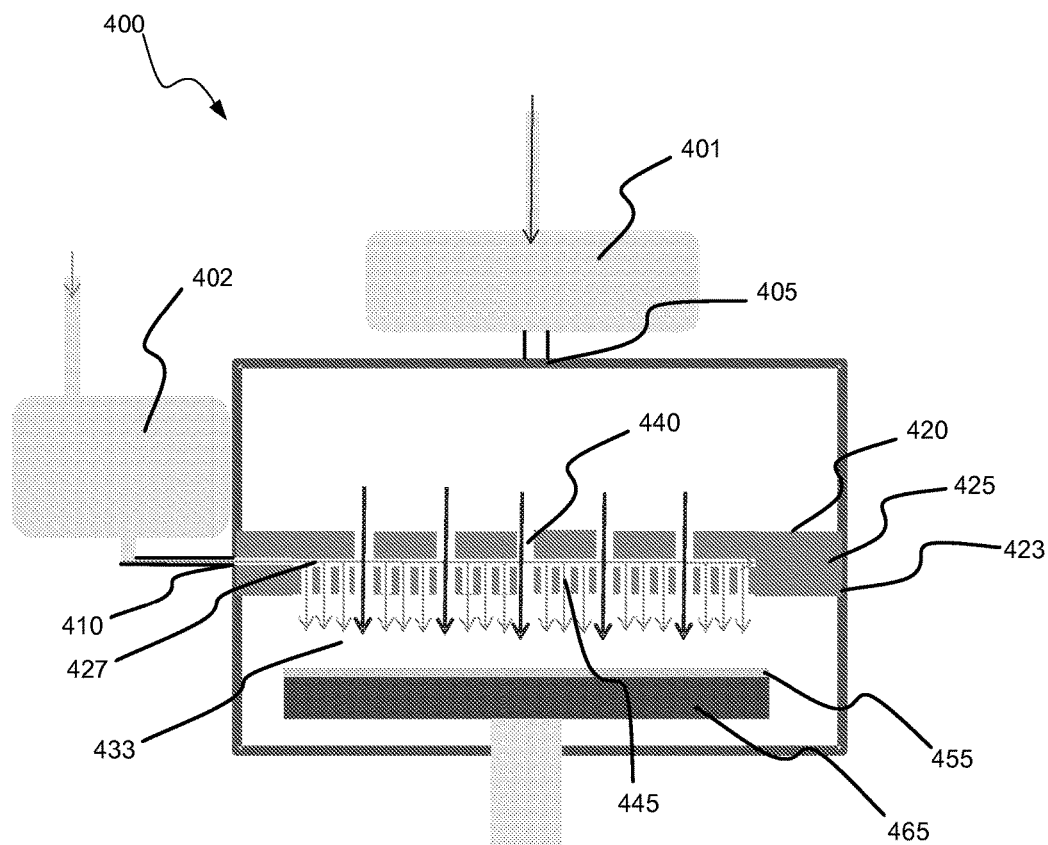
FIG. 4 shows a simplified cross-sectional view of a processing chamber according to one or more embodiment of the disclosure.

Turning to FIG. 4, a simplified schematic of processing chamber 400 is shown according to the disclosed technology. The chamber 400 may include any of the components as previously discussed, and may be configured to house a semiconductor substrate 455 in a processing region 433 of the chamber. The substrate 455 may be located on a pedestal 465 as shown. Processing chamber 400 may include two remote plasma systems (RPS) 401, 402. A first RPS unit 401 may be fluidly coupled with a first access 405 of the chamber 400, and may be configured to deliver a first precursor into the chamber 400 through the first access 405. A second RPS unit 402 may be fluidly coupled with a second access 410 of the chamber 400, and may be configured to deliver a second precursor into the chamber 400 through the second access 410. First and second plasma units 401, 402 may be the same or different plasma systems. For example, either or both systems may be RF plasma systems, CCP plasma chambers, ICP plasma chambers, magnetically generated plasma systems including toroidal plasma systems, microwave plasma systems, etc., or any other system type capable of forming a plasma or otherwise exciting and/or dissociating molecules therein. The system may be configured to maintain the first and second precursors fluidly isolated from one another until they are delivered to the process region 433 of the chamber 400. First access 405 may be located near to or at the top of the processing chamber 400, and second access 410 may be located near or along one of the side portions of the chamber 400.

Chamber 400 may further include a gas distribution assembly 425 within the chamber. The gas distribution assembly 425, which may be similar in aspects to the dual-channel showerheads as previously described, may be located within the chamber 400 at a top portion of the processing region 433, or above the processing region 433. The gas distribution assembly 425 may be configured to deliver both the first and second precursors into the processing region 433 of the chamber 400. Although the exemplary system of FIG. 4 includes a dual-channel showerhead, it is understood that alternative distribution assemblies may be utilized that maintain first and second precursors fluidly isolated prior to the processing region 433. For example, a perforated plate and tubes underneath the plate may be utilized, although other configurations may operate with reduced efficiency or not provide as uniform processing as the dual-channel showerhead as described.

The gas distribution assembly 425 may comprise an upper plate 420 and a lower plate 423 as previously discussed. The plates may be coupled with one another to define a volume 427 between the plates. The coupling of the plates may be such as to provide first fluid channels 440 through the upper and lower plates, and second fluid channels 445 through the lower plate 423. The formed channels may be configured to provide fluid access from the volume 427 through the lower plate 423, and the first fluid channels 440 may be fluidly isolated from the volume 427 between the plates and the second fluid channels 445. The volume 427 may be fluidly accessible through a side of the gas distribution assembly 425, such as channel 322 as previously discussed. This portion of the gas distribution assembly may be fluidly coupled with the second access 410 in the chamber through which RPS unit 402 may deliver the second precursor.

The chamber may be configured to deliver the first precursor into the processing region 433 of the chamber from the first RPS unit 401, through the first access 405 in the chamber. The first precursor may then be delivered through the first fluid channels 440 in the gas distribution assembly 425. The chamber may additionally be configured to provide the second precursor into the chamber from the second RPS 402 through the second access 410 in the chamber 400. The second precursor may flow through the access 410 and into the gas distribution assembly 425. The second precursor may flow through the gas distribution assembly into the volume 427 defined between the upper and lower plates, and then flow down into the processing region 433 through the second fluid channels 445 in the lower plate 423 of the gas distribution assembly 425. From the coupling and configuration of the upper plate 420 and lower plate 423, the assembly may be configured to prevent the flow of the second precursor through the upper plate 420 of the assembly 425. This may be due to the alignment of apertures in the assembly as discussed previously.

The plasma cavities of the RPS units 401, 402, and any mechanical couplings leading to the chamber accesses 405, 410 may be made of materials based on the first and second precursors selected to be flowed through the RPS units 401, 402. For example, in certain etching operations, a fluorine-containing precursor (e.g., NF3) may be flowed through either of the first and second RPS units, such as RPS unit 401. When a plasma is formed in the RPS unit 401, the molecules may dissociate into radical ions. If the RPS unit 401 is made of an unaltered aluminum, fluorine radicals may react with the cavity walls forming byproducts such as aluminum fluoride. Accordingly, RPS unit 401 may be formed with a first material that may be for example aluminum oxide, aluminum nitride, or another material with which the first precursor does not interact. The material of the RPS unit 401 may be selected based on the composition of the first precursor, and may be specifically selected such that the precursor does not interact with the chamber components.

Similarly, the second RPS unit 402 may be made of a second material that is selected based on the second precursor. In disclosed embodiments, the first and second material may be different materials. For example, if a hydrogen-containing precursor is flowed through the second RPS 402 and a plasma is formed, dissociated hydrogen radicals may interact with the plasma cavity of the RPS 402. If the chamber is similarly made of aluminum oxide, for example, the hydrogen radicals will interact with the oxide, and may remove the protective coating. Accordingly, RPS unit 402 may be made of a second material different from the first such as aluminum, or another material with which the second precursor does not interact. This may be extended to the gas distribution assembly as well, with the upper surface of the upper plate 420 being made of or coated with the same material used in the first RPS, and the bottom surface of the upper plate 420 and the upper surface of the lower plate 423 being made of or coated with the same material used in the second RPS. Such coatings or materials selections may improve equipment degradation over time. Accordingly, the gas distribution assembly plates may each include multiple plates made of one or more materials.

In operation, one or both of the RPS units 401, 402 may be used to produce a plasma within the unit to at least partially ionize the first and/or second precursor. In one example in which a fluorine-containing precursor and a hydrogen-containing precursor are utilized, the hydrogen-containing precursor may be flowed through the first RPS unit 401 and the fluorine-containing radical may be flowed through the second RPS unit 402. Such a configuration may be based on the travel distances for the radical species. For example, the path to the processing region 433 may be shorter from the first RPS unit 401. Because hydrogen radicals may recombine more quickly than fluorine radicals due to a shorter half-life, the hydrogen-containing radicals may be flowed through the shorter paths. Additionally, a plasma as described earlier may be formed in the region of the chamber 400 above the gas distribution assembly 425 in order to prolong, continue, or enhance the radical species. However, other configurations disclosed may flow the hydrogen-containing precursor through the second RPS unit 402.

The RPS units 401, 402 may be operated at power levels from between below or about 10 W up to above or about 10 or 15 kW in various embodiments. The inventors have advantageously determined that an additional benefit of the disclosed technology is that the power and plasma profile of each RPS unit may be tuned to the particular precursor used. For example, continuing the example with a fluorine-containing precursor and a hydrogen-containing precursor, some conventional systems require that both precursors requiring dissociation be flowed through the same RPS unit. In addition to the potential deterioration of the plasma cavity and RPS unit as discussed above, a plasma profile beneficial to both precursors may not be available. Continuing the example, fluorine-containing precursors including $NF_3$ may be processed at a relatively low level of power in the RPS unit. By operating the RPS at a power level at or below 100 W, 200 W, 400 W, up to 1000 W or more, the precursor may be dissociated to a lesser degree that does not completely ionize the particles, and includes independent radicals including NF and $NF_2$ species as well. Additionally, the RPS unit processing the hydrogen-containing precursor may be operated at a much higher power level as complete dissociation may be desired. Accordingly, the RPS unit may be operated between up to or above about 1000 W and up to or above about 10 kW or more. The RF frequency applied in the exemplary processing system may be low RF frequencies less than about 500 kHz, high RF frequencies between about 10 MHz and about 15 MHz or microwave frequencies greater than or about 1 GHz in different embodiments. As such, the first RPS unit 401 may be configured to operate at a first power level that is selected based on the composition of the first precursor, and the second RPS may be configured to operate at a second power level that is selected based on the composition of the second precursor. The two RPS units 401, 402 may be configured to operate at power levels different from one another. Such a configuration may require separate or decoupled power sources, among other changes.

Additional flexibility may be provided by operating one of the RPS units but not the other. For example, a fluorine-containing precursor may be flowed through the first RPS unit 401 that is configured to operate at a power level that may be lower based on the precursor. A hydrogen-containing precursor may be flowed through the second RPS unit 402 in which a plasma is not formed such that the molecular precursor flows to the processing region 433. When the first and second precursors separately exit the gas distribution assembly 425 they may interact, and the first precursor that has been at least partially radicalized in RPS unit 401 may ionize a portion of the second precursor, in which case power efficiency of the system may be improved. Based on these examples, it is understood that many aspects may be reversed or changed in disclosed embodiments of the technology based on various operational characteristics.

Figure 5:
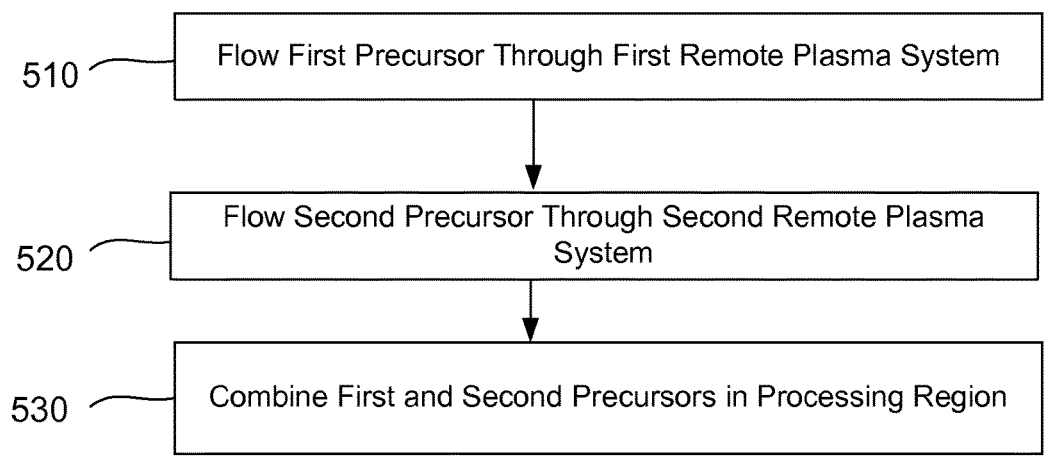
FIG. 5 shows a flowchart of a method of operation for a semiconductor processing chamber according to one or more embodiment of the disclosure.

In order to better understand and appreciate the invention, reference is now made to FIG. 5 which is a flow chart of an etch process, specifically a silicon-selective etch, according to disclosed embodiments. It is understood that the technology can similarly be utilized for deposition processes. Silicon may be amorphous, crystalline, or polycrystalline (in which case it is usually referred to as polysilicon). Prior to the first operation, a structure may be formed in a patterned substrate. The structure may possess separate exposed regions of silicon and silicon oxide. Previous deposition and formation processes may or may not have been performed in the same chamber. If performed in a different chamber, the substrate may be transferred to a system such as that described above.

A first precursor such as a hydrogen-containing precursor, may be flowed into a first plasma region separate from the substrate processing region at operation 510. The separate plasma region may be referred to as a remote plasma region herein and may be within a distinct module from the processing chamber or a compartment within the processing chamber. Generally speaking, a hydrogen-containing precursor may be flowed into the first plasma region in which it is excited in a plasma, and the hydrogen-containing precursor may comprise at least one precursor selected from $H_2$, $NH_3$, hydrocarbons, or the like. A flow of a second precursor such as nitrogen trifluoride, or a different fluorine-containing precursor, may be introduced into a second remote plasma system at operation 520 where it is excited in a plasma. The first and second plasma systems may be operated in any fashion as previously discussed, and in disclosed embodiments the hydrogen-containing precursor and the fluorine-containing precursor may be flowed through the alternative RPS unit. Additionally, only one of the remote plasma systems may be operated in disclosed embodiments. The flow rate of the nitrogen trifluoride may be low relative to the flow rate of the hydrogen to effect a high atomic flow ratio H:F as will be quantified shortly. Other sources of fluorine may be used to augment or replace the nitrogen trifluoride. In general, a fluorine-containing precursor may be flowed into the second remote plasma region and the fluorine-containing precursor comprises at least one precursor selected from the group consisting of atomic fluorine, diatomic fluorine, bromine trifluoride, chlorine trifluoride, nitrogen trifluoride, hydrogen fluoride, fluorinated hydrocarbons, sulfur hexafluoride, and xenon difluoride.

The plasma effluents formed in the remote plasma regions of the first and second precursors may then be separately flowed into and then combined in the substrate processing region at operation 530. The patterned substrate may be selectively etched such that the exposed silicon is removed at a rate at least or about seventy times greater than the exposed silicon oxide. The technology may involve maintenance of a high atomic flow ratio of hydrogen (H) to fluorine (F) in order achieve high etch selectivity of silicon. Some precursors may contain both fluorine and hydrogen, in which case the atomic flow rate of all contributions are included when calculating the atomic flow ratio described herein. The preponderance of hydrogen may help to hydrogen terminate exposed surfaces on the patterned substrate. Under the conditions described herein, hydrogen termination may be metastable on only the silicon surfaces. Fluorine from the nitrogen trifluoride or other fluorine-containing precursor displaces the hydrogen on the silicon surface and creates volatile residue which leaves the surface and carries silicon away. Due to the strong bond energies present in the other exposed materials, the fluorine may be unable to displace the hydrogen of the other hydrogen terminated surfaces (and/or is unable to create volatile residue to remove the other exposed material).

In one example, a gas flow ratio ($H_2:NF_3$) greater than or about 15:1, or in general terms, greater than or about an atomic flow ratio of between 10:1, was found to achieve etch selectivity (silicon:silicon oxide or silicon:silicon nitride) of greater than or about 70:1. The etch selectivity (silicon:silicon oxide or silicon:silicon nitride) may also be greater than or about 100:1, greater than or about 150:1, greater than or about 200:1, greater than or about 250:1 or greater than or about 300:1 in disclosed embodiments, or between or among any of these ranges. Regions of exposed tungsten, titanium nitride, or other metals may also be present on the patterned substrate and may be referred to as exposed metallic regions. The etch selectivity (silicon:exposed metallic region) may be greater than or about 100:1, greater than or about 150:1, greater than or about 200:1, greater than or about 250:1, greater than or about 500:1, greater than or about 1000:1, greater than or about 2000:1 or greater than or about 3000:1 in disclosed embodiments. The reactive chemical species are removed from the substrate processing region and then the substrate is removed from the processing region.

The presence of the high flow of hydrogen-containing precursor, as described herein, ensures that silicon, silicon oxide and silicon nitride maintain a hydrogen-terminated surface during much of the processing. The fluorine-containing precursor and/or the hydrogen-containing precursor may further include one or more relatively inert gases such as He, $N_2$, Ar, or the like. The inert gas can be used to improve plasma stability and/or to carry liquid precursors to the remote plasma region. Flow rates and ratios of the different gases may be used to control etch rates and etch selectivity. In an embodiment, the fluorine-containing gas includes $NF_3$ at a flow rate of between about 1 sccm (standard cubic centimeters per minute) and 30 sccm, and $H_2$ at a flow rate of between about 500 sccm and 5,000 sccm, He at a flow rate of between about 0 sccm and 3000 sccm, and Ar at a flow rate of between about 0 sccm and 3000 sccm. The atomic flow ratio H:F may be kept high in disclosed embodiments to reduce or eliminate solid residue formation on silicon oxide. The formation of solid residue consumes some silicon oxide which may reduce the silicon selectivity of the etch process. The atomic flow ratio H:F may be greater than or about twenty five (i.e. 25:1), greater than or about 30:1 or greater than or about 40:1 in embodiments of the technology.

By maintaining the precursors fluidly separate, corrosion and other interaction with the RPS systems may be reduced or eliminated. As described above, the RPS units and distribution components including the gas distribution assembly may be made of materials selected based on the precursors being delivered, and thus selected to prevent reaction between the ionized precursors and the equipment.

An ion suppressor may be used to filter ions from the plasma effluents during transit from the remote plasma region to the substrate processing region in embodiments of the invention. The ion suppressor functions to reduce or eliminate ionically charged species traveling from the plasma generation region to the substrate. Uncharged neutral and radical species may pass through the openings in the ion suppressor to react at the substrate. It should be noted that complete elimination of ionically charged species in the reaction region surrounding the substrate is not always the desired goal. In many instances, ionic species are required to reach the substrate in order to perform the etch and/or deposition process. In these instances, the ion suppressor helps control the concentration of ionic species in the reaction region at a level that assists the process. In disclosed embodiments the upper plate of the gas distribution assembly may include an ion suppressor.

The temperature of the substrate can be maintained at a single temperature during processing or can be subjected to changing temperatures. In some embodiments, the temperature of the substrate is greater than or equal to about 350° C., 375° C., 400° C., 425° C. or 450° C. In some embodiments, the temperature of the substrate is sufficient to allow a titanium chloride species to react with silicon to form a titanium silicide and not react with silicon oxide or silicon nitride.

The data further show an increase in silicon etch rate as a function of process pressure (for a given hydrogen:fluorine atomic ratio). However, for an atomic flow rate ratio of about 50:1 H:F, increasing the pressure above 1 Torr may begin to reduce the selectivity. This is suspected to result from a higher probability of combining two or more fluorine-containing effluents. The etch process may then begin to remove silicon oxide, silicon nitride, and other materials. The pressure within the substrate processing region may be below or about 10 Torr, below or about 5 Torr, below or about 3 Torr, below or about 2 Torr, below or about 1 Torr or below or about 750 mTorr in disclosed embodiments. In order to ensure adequate etch rate, the pressure may be above or about 0.05 Torr, above or about 0.1 Torr, above or about 0.2 Torr or above or about 0.4 Torr in embodiments of the invention.

In the preceding description, for the purposes of explanation, numerous details have been set forth in order to provide an understanding of various embodiments of the present invention. It will be apparent to one skilled in the art, however, that certain embodiments may be practiced without some of these details, or with additional details.

Having disclosed several embodiments, it will be recognized by those of skill in the art that various modifications, alternative constructions, and equivalents may be used without departing from the spirit of the disclosed embodiments. Additionally, a number of well-known processes and elements have not been described in order to avoid unnecessarily obscuring the present invention. Accordingly, the above description should not be taken as limiting the scope of the invention.

Where a range of values is provided, it is understood that each intervening value, to the smallest fraction of the unit of the lower limit, unless the context clearly dictates otherwise, between the upper and lower limits of that range is also specifically disclosed. Any narrower range between any stated values or unstated intervening values in a stated range and any other stated or intervening value in that stated range is encompassed. The upper and lower limits of those smaller ranges may independently be included or excluded in the range, and each range where either, neither, or both limits are included in the smaller ranges is also encompassed within the technology, subject to any specifically excluded limit in the stated range. Where the stated range includes one or both of the limits, ranges excluding either or both of those included limits are also included.

Figure 6:
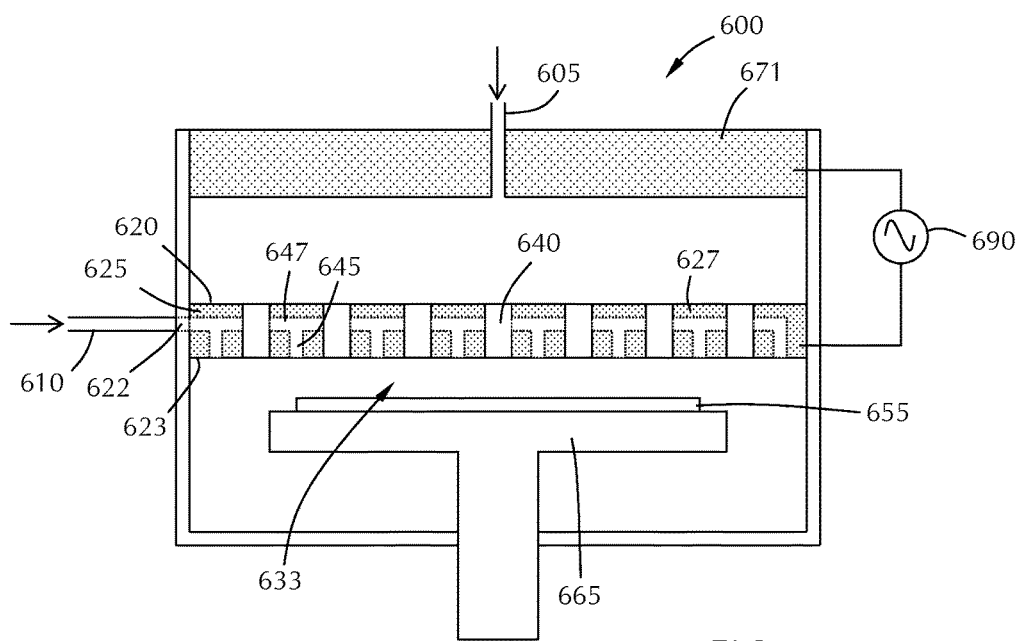
FIG. 6 shows a simplified cross-sectional view of a processing chamber according to one or more embodiment of the disclosure.

FIG. 6 shows a simplified schematic of processing chamber 600 in accordance with one or more embodiments of the disclosure. The chamber 600 may include any of the components as previously discussed, and may be configured to house a semiconductor substrate 655 in a processing region 633 of the chamber 600. The substrate 655 may be located on a pedestal 665 as shown.

A dual channel gas distribution assembly 625 is positioned within the interior of the processing chamber 600 at a top portion of the processing region 633, or above the processing region 633. In the embodiment shown the processing region 633 has an upper boundary defined by the gas distribution assembly 625. The gas distribution assembly 625 may be configured to deliver both the first and second precursors into the processing region 633 of the chamber 600 so that the first and second precursors do not mix prior to entering the processing region 633.

The gas distribution assembly 625 may comprise an upper plate 620 and a lower plate 623. The plates may be coupled with one another to define a volume 627 between the plates. The coupling of the plates may be such as to provide first fluid channels 640 through the upper and lower plates, and second fluid channels 645 through the lower plate 623. The formed channels may be configured to provide fluid access from the volume through the lower plate 623, and the first fluid channels 640 may be fluidly isolated from the volume 627 between the plates and the second fluid channels 645. The volume 627 may be fluidly accessible through a side of the gas distribution assembly 625, such as channel 622.

Access 405 may be located near to or at the top 671 of the processing chamber 600 and is fluidly coupled to volume 603. A gaseous species can be flowed into volume 603 through access 605. In volume 603, the gaseous species can be ignited to form a plasma. The plasma is formed remotely from the processing region 633 and adjacent the upper plate 620. The first fluid channels 640 provide a pathway for the plasma generated in the volume 603 to pass through the gas distribution assembly 626 into processing region 633.

The plasma is formed in volume 603 by any suitable plasma generation hardware. For example, a capacitively coupled plasma (CCP) may be generated between the top 671 and the gas distribution assembly 625. In the embodiment shown, a power source 690 is electrically connected to the top 671 and the gas distribution assembly 625 to generate the plasma in volume 603. Other plasma generation systems include, but are not limited to, inductively coupled plasma (ICP), magnetically generated plasma systems and microwave plasma systems. While the plasma is formed in volume 603 within the processing chamber 600, the plasma generation systems and configurations for the RPS 401, 402 are similar to the plasma generation systems and configurations of the embodiment of FIG. 6.

The chamber 600 shown is configured to deliver the second precursor into the processing region 633 of the chamber through the access 610 and second fluid channels 645 and passage 647 through the volume 627 of the gas distribution assembly 625. The second precursor may flow through the access 610 and into the gas distribution assembly 625. The second precursor may flow through passage 647 of the gas distribution assembly 625 between the upper and lower plates, and then flow down into the processing region 633 through the second fluid channels 645 in the lower plate 623 of the gas distribution assembly 625. From the coupling and configuration of the upper plate 620 and lower plate 623, the assembly may be configured to prevent the flow of the second precursor through the upper plate 620 of the assembly 625. This may be due to the alignment of apertures in the assembly.

In some embodiments of the processing method, a first precursor is flowed into a volume 603 which is bounded by a top 671 of the processing chamber and the upper plate 620 of the gas distribution assembly 625. The first precursor is energized in the volume 603 and allowed to flow through first fluid channels 640 in the gas distribution assembly 625 to processing region 633. As used in this regard, "energized" means that one or more of ions or radicals of the first precursor are generated in the volume 603. In some embodiments, the energized first precursor forms a plasma of the first precursor. The first precursor can be co-flowed with one or more carrier gases or other reactive gases. In some embodiments, the first precursor is co-flowed with argon as a carrier gas.

A second precursor is flowed through second fluid channels 645 in the gas distribution assembly 625 into the processing region 633 and allowed to react with the energized first precursor. In some embodiments, the first fluid channel and the second fluid channel are isolated to prevent gas phase mixing of the first precursor and the second precursor until the precursors are in the processing region. In some embodiments, the second precursor does not pass through a plasma generator so that only the first precursor is energized before entering the processing region 633.

A substrate 655 is provided in the processing region 633 and the first precursor and second precursor deposit a film on the substrate 655. In some embodiments, the substrate 655 has a first surface 692 and a second surface 693 that is different than the first surface 692. For example, the first surface can be a metal surface and the second surface can be a dielectric, or vice versa. In some embodiments, the first surface comprises silicon and the second surface comprises silicon oxide. In some embodiments, the first surface comprises silicon and the second surface comprises silicon nitride. In some embodiments, the first surface comprises silicon and the second surface comprises silicon oxynitride. In some embodiments, the first surface comprises silicon and the second surface comprises one or more of silicon oxide or silicon nitride.

In some embodiments, the first precursor comprises hydrogen ($H_2$) and energizing the first precursor produces $H^+$ and $H^*$ species. In some embodiments, the hydrogen ions and radicals are formed as part of a plasma and allowed to flow through the first fluid channels into the processing region.

In some embodiments, the second precursor comprises a metal halide. The metal can be any suitable metal species and the halide can be any suitable halogen. The metal halide can be a mixture of different halogens or substantially the same halogen atom. In some embodiments, the metal halide comprises substantially only chlorine atoms. As used in this regard, "substantially only" means that there is greater than or equal to about 95 atomic percent of the stated halogen species. In some embodiments, the halogen is one or more of fluorine, chlorine, bromine or iodine. In some embodiments, there are substantially no fluorine atoms; meaning that there is less than about 1% on an atomic basis of all halogen atoms.

In one or more embodiments, the metal halide is a titanium chloride. The titanium chloride $TiCl_x$ can be a mixture of titanium oxidation states or substantially all the same oxidation state (i.e., >95% the same oxidation state on an atomic basis). For example, the titanium chloride can be a mixture of $TiCl_3$ and $TiCl_4$ species, or other species.

Figure 7:
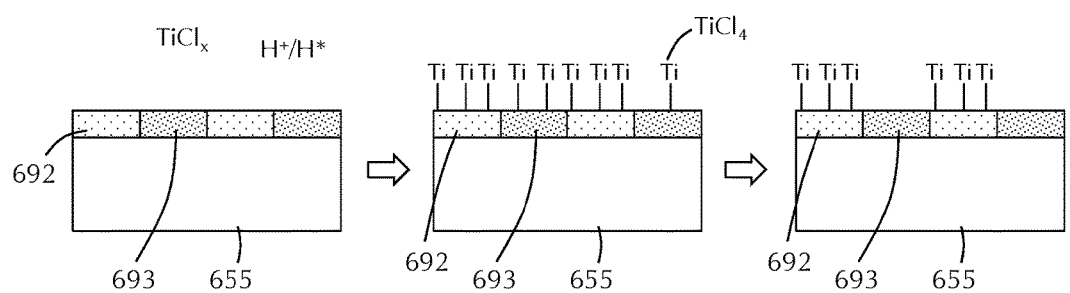
FIG. 7 shows a schematic representation of a selective deposition process in accordance with one or more embodiment of the disclosure.

Referring to FIG. 7, without being bound by any particular theory of operation, it is believed that the titanium chloride reacts with the $H^+/H^*$ species to deposit a titanium film on the substrate. The titanium film forms on the first surface 692 and the second surface 693. Unreacted titanium chloride is believed to etch the titanium film formed on the second surface 693 to selectively deposit a titanium film on the first surface 692. The titanium film can form equally or unequally on the first and second surfaces with etching resulting in selective deposition. In some embodiments, the metal film is formed on the first surface preferentially to the second surface and etching increases the selectivity. In some embodiments, the first surface 692 comprises silicon and the second surface 693 comprises one or more of silicon oxide or silicon nitride.

The selectivity of the deposition is greater than or equal to about 10:1. As used in this manner, selectivity is the amount of film formed on the first surface relative to the second surface. In some embodiments, the selectivity is greater than or equal to about 15:1, 20:1, 25:1, 30:1, 35:1 or 40:1.

According to one or more embodiments, the substrate is subjected to processing prior to and/or after forming the layer. This processing can be performed in the same chamber or in one or more separate processing chambers. In some embodiments, the substrate is moved from the first chamber to a separate, second chamber for further processing. The substrate can be moved directly from the first chamber to the separate processing chamber, or it can be moved from the first chamber to one or more transfer chambers, and then moved to the separate processing chamber. Accordingly, the processing apparatus may comprise multiple chambers in communication with a transfer station. An apparatus of this sort may be referred to as a "cluster tool" or "clustered system," and the like.

Generally, a cluster tool is a modular system comprising multiple chambers which perform various functions including substrate center-finding and orientation, annealing, annealing, deposition and/or etching. According to one or more embodiments, a cluster tool includes at least a first chamber and a central transfer chamber. The central transfer chamber may house a robot that can shuttle substrates between and among processing chambers and load lock chambers. The transfer chamber is typically maintained at a vacuum condition and provides an intermediate stage for shuttling substrates from one chamber to another and/or to a load lock chamber positioned at a front end of the cluster tool. Two well-known cluster tools which may be adapted for the present disclosure are the Centura® and the Endura®, both available from Applied Materials, Inc., of Santa Clara, Calif. However, the exact arrangement and combination of chambers may be altered for purposes of performing specific steps of a process as described herein. Other processing chambers which may be used include, but are not limited to, cyclical layer deposition (CLD), atomic layer deposition (ALD), chemical vapor deposition (CVD), physical vapor deposition (PVD), etch, pre-clean, chemical clean, thermal treatment such as RTP, plasma nitridation, anneal, orientation, hydroxylation and other substrate processes. By carrying out processes in a chamber on a cluster tool, surface contamination of the substrate with atmospheric impurities can be avoided without oxidation prior to depositing a subsequent film.

According to one or more embodiments, the substrate is continuously under vacuum or "load lock" conditions, and is not exposed to ambient air when being moved from one chamber to the next. The transfer chambers are thus under vacuum and are "pumped down" under vacuum pressure. Inert gases may be present in the processing chambers or the transfer chambers. In some embodiments, an inert gas is used as a purge gas to remove some or all of the reactants. According to one or more embodiments, a purge gas is injected at the exit of the deposition chamber to prevent reactants from moving from the deposition chamber to the transfer chamber and/or additional processing chamber. Thus, the flow of inert gas forms a curtain at the exit of the chamber.

The substrate can be processed in single substrate deposition chambers, where a single substrate is loaded, processed and unloaded before another substrate is processed. The substrate can also be processed in a continuous manner, similar to a conveyer system, in which multiple substrate are individually loaded into a first part of the chamber, move through the chamber and are unloaded from a second part of the chamber. The shape of the chamber and associated conveyer system can form a straight path or curved path. Additionally, the processing chamber may be a carousel in which multiple substrates are moved about a central axis and are exposed to deposition, etch, annealing, cleaning, etc. processes throughout the carousel path.

During processing, the substrate can be heated or cooled. Such heating or cooling can be accomplished by any suitable means including, but not limited to, changing the temperature of the substrate support and flowing heated or cooled gases to the substrate surface. In some embodiments, the substrate support includes a heater/cooler which can be controlled to change the substrate temperature conductively. In one or more embodiments, the gases (either reactive gases or inert gases) being employed are heated or cooled to locally change the substrate temperature. In some embodiments, a heater/cooler is positioned within the chamber adjacent the substrate surface to convectively change the substrate temperature.

The substrate can also be stationary or rotated during processing. A rotating substrate can be rotated continuously or in discreet steps. For example, a substrate may be rotated throughout the entire process, or the substrate can be rotated by a small amount between exposures to different reactive or purge gases. Rotating the substrate during processing (either continuously or in steps) may help produce a more uniform deposition or etch by minimizing the effect of, for example, local variability in gas flow geometries.

Reference throughout this specification to "one embodiment," "certain embodiments," "one or more embodiments" or "an embodiment" means that a particular feature, structure, material, or characteristic described in connection with the embodiment is included in at least one embodiment of the disclosure. Thus, the appearances of the phrases such as "in one or more embodiments," "in certain embodiments," "in one embodiment" or "in an embodiment" in various places throughout this specification are not necessarily referring to the same embodiment of the disclosure. Furthermore, the particular features, structures, materials, or characteristics may be combined in any suitable manner in one or more embodiments.

Although the disclosure herein has been described with reference to particular embodiments, it is to be understood that these embodiments are merely illustrative of the principles and applications of the present disclosure. It will be apparent to those skilled in the art that various modifications and variations can be made to the method and apparatus of the present disclosure without departing from the spirit and scope of the disclosure. Thus, it is intended that the present disclosure include modifications and variations that are within the scope of the appended claims and their equivalents.

What is claimed is:

1. A processing method comprising:
   flowing a first precursor comprising $H_2$ into a volume in a processing chamber, the volume bounded by a chamber top and a gas distribution assembly;
   energizing the first precursor in the volume to form $H^+$ and $H^*$ species and allowing the first precursor to flow through first fluid channels formed in the gas distribution assembly into a processing region in the processing chamber;

flowing a second precursor comprising a metal halide comprising titanium chloride through the gas distribution assembly through second fluid channels into the processing region to react the first precursor in the processing region; and contacting a substrate with the energized first precursor and the second precursor, the substrate having a first surface comprising Si and a second surface different from the first surface, the second surface comprising $SiO_2$ or SiN, wherein the titanium chloride and the $H^+$ and $H^*$ species react to deposit a titanium film on the first surface and the second surface, and unreacted titanium chloride etches the titanium film formed on the second surface to selectively deposit a titanium film on the first surface.

2. The processing method of claim 1, wherein the first fluid channel and the second fluid channel isolated to prevent mixing of the first precursor and the second precursor until the precursors are in the processing region.

3. The processing method of claim 1, wherein the second precursor does not pass through a plasma generator so that only the first precursor is energized before entering the processing region.

4. The processing method of claim 1, wherein selectivity is greater than or equal to about 10:1.

5. The processing method of claim 1, wherein the first precursor is co-flowed with a carrier gas.

6. A processing method comprising:
positioning a substrate with a first surface comprising Si and a second surface different from the first surface in a processing region of a processing chamber, the second surface comprising $SiO_2$ or SiN;

flowing an energized first precursor through a dual channel gas distribution assembly into the processing region, the energized first precursor comprises $H^+$ and $H^*$ species;

flowing a second precursor through the dual channel gas distribution assembly into the processing region, the second precursor comprising a metal halide; and reacting the energized first precursor and the second precursor in the processing region to deposit a film on the first surface, wherein the metal halide and the $H^+$ and $H^*$ species react to deposit a metal film on the first surface and the second surface and unreacted metal halide etches the metal film formed on the second surface to selectively deposit a metal film on the first surface with a selectivity greater than or equal to about 10:1.

7. The processing method of claim 6, wherein the energized first precursor flows through first fluid channels in the gas distribution assembly and the second precursor flows through second fluid channel in the gas distribution assembly, the first fluid channels isolated from the second fluid channels to prevent mixing of the energized first precursor and the second precursor until the precursors are in the processing region.

8. The processing method of claim 6, wherein the second precursor is not energized before passing through the gas distribution assembly.

* * * * *